(12) United States Patent
Ramasamy et al.

(10) Patent No.: US 8,404,768 B2
(45) Date of Patent: Mar. 26, 2013

(54) THERMAL INTERFACE MATERIALS AND METHODS FOR MAKING THEREOF

(75) Inventors: Ramamoorthy Ramasamy, Westerville, OH (US); Gregory W. Shaffer, Strongsville, OH (US); Paulo Meneghetti, Avon, OH (US)

(73) Assignee: Momentive Performance Materials Inc., Waterford, NY (US)

( * ) Notice: Subject to any disclaimer, the term of this patent is extended or adjusted under 35 U.S.C. 154(b) by 394 days.

(21) Appl. No.: 12/448,833

(22) PCT Filed: Jan. 9, 2008

(86) PCT No.: PCT/US2008/000303
§ 371 (c)(1),
(2), (4) Date: Mar. 12, 2010

(87) PCT Pub. No.: WO2008/085999
PCT Pub. Date: Jul. 17, 2008

(65) Prior Publication Data
US 2010/0200801 A1    Aug. 12, 2010

Related U.S. Application Data

(60) Provisional application No. 60/884,249, filed on Jan. 10, 2007.

(51) Int. Cl.
*C08K 3/00* (2006.01)

(52) U.S. Cl. .......................................... 524/404; 252/74
(58) Field of Classification Search .................. 524/404
See application file for complete search history.

(56) References Cited

U.S. PATENT DOCUMENTS

| | | | |
|---|---|---|---|
| 6,037,397 A | | 3/2000 | Satoh et al. |
| 6,048,511 A | * | 4/2000 | Shaffer et al. ................. 423/290 |
| 2003/0073769 A1 | * | 4/2003 | Pujari et al. .................... 524/404 |
| 2003/0139510 A1 | * | 7/2003 | Sagal et al. ..................... 524/404 |
| 2003/0153665 A1 | | 8/2003 | Tobita et al. |
| 2008/0076856 A1 | * | 3/2008 | Zhong et al. ..................... 524/81 |
| 2008/0153960 A1 | * | 6/2008 | Meneghetti et al. ........... 524/404 |

FOREIGN PATENT DOCUMENTS

| | | |
|---|---|---|
| EP | 1109218 | 6/2001 |
| JP | 3568401 B2 | 6/2004 |

OTHER PUBLICATIONS

Thomson Scientific 1996-480986 & JP 08-224094 (Sep. 24, 1996).
Thomson Scientific 1999-259477 & JP11-077795 (Mar. 23, 1999).
Thomson Scientific 1991-233907 & JP 03-151658 (Jun. 27, 1991).

* cited by examiner

*Primary Examiner* — Doris Lee
(74) *Attorney, Agent, or Firm* — Joseph E. Waters

(57) ABSTRACT

A thermal interface material is constructed from a base matrix comprising a polymer and 5 to 90 wt. % of boron nitride filler having a platelet structure, wherein the platelet structure of the boron nitride particles are substantially aligned for the thermal interface material to have a bulk thermal conductivity of at least 1 W/mK.

20 Claims, 1 Drawing Sheet

THERMAL INTERFACE MATERIALS AND METHODS FOR MAKING THEREOF

CROSS-REFERENCE TO RELATED APPLICATIONS

This application claims priority to, and the benefit of the filing date of, U.S. Provisional Patent Application No. 60/884,249, filed on Jan. 10, 2007.

FIELD OF THE INVENTION

The present invention relates to a thermal interface material and methods of manufacturing a thermal interface material.

BACKGROUND OF THE INVENTION

Advances in microelectronics technology have resulted in electronic devices that process signals and data at unprecedented high speeds. Electronic and/or integrated circuit ("IC") devices, e.g., microprocessors, memory devices, etc, become smaller while heat dissipation requirements get larger. Thermal materials have been used in packaging as interfaces between devices to dissipate heat from these devices (e.g., microprocessors). One typical thermal interface material (TIM) typically includes a polymer matrix and a thermally conductive filler. The TIM technologies used for electronic packages encompass several classes of materials such as phase change materials, epoxies, greases, and gels.

Boron nitride (BN) is a chemically inert non-oxide ceramic material which has a multiplicity of uses based upon its electrical insulating property, corrosion resistance, high thermal conductivity and lubricity. As illustrated in FIG. 1, thermal conductivity along the x-y plane of a boron nitride platelet is greater than through the thickness (z-direction) of the platelet. Thermal conductivity of the z-direction of the boron nitride hexagonal crystal structure is 2.0 W/mK, while the thermal conductivity in the x-y plane is 400 W/mK, as described in "Characterization and Performance of Thermally Conductive Epoxy Compound Fillers", R. F. Hill, *SMTA National Symposium "Emerging Packaging Technologies"*, Research Triangle Park, N.C., Nov. 18-21, 1996. BN platelets have a thermal conductivity of 59 W/mK in the direction parallel to the pressing direction and 33 W/mK in the direction perpendicular to the pressing direction (as measured in hot pressed BN shapes of approximately 90 to 95% of theoretical density). A preferred use for BN is as a filler material additive to a polymeric compound, for use in a thermal interface application.

US Patent Publication No. 2004-0077764 discloses a thermal interface material composed of a polymer selected from the group consisting of a polyester, epoxy or polyamide and spherical agglomerate particles of BN loaded to a concentration of between 30-50 wt. % BN. As disclosed in US 2006-0127422, thermal interface materials comprising these spherical BN particles have a thermal conductivity ranging from 1 W/mK to about 40 W/mK. When platelet-shaped hBN particles, i.e., less expensive BN powder not in spherical agglomerate form, are used in thermal interface materials at a similar loading (and depending on the polymer matrix used), one typically obtains a maximum through-plane thermal conductivity (TC) in the range 0.3-6 W/mK. U.S. Pat. No. 6,919,504 discloses a flexible heat sink article comprising a base comprising a polymer and a plurality of polymeric protrusions, wherein the protrusions comprise non-spherical thermally conductive particles substantially aligned in the direction of the major dimension within the protrusions.

There is still a need for thermal interface materials and methods for making thermal interface materials having improved thermal conductivity property by maximizing the anisotropic benefit of boron nitride to the fullest extent.

BRIEF SUMMARY OF THE INVENTION

The invention provides a thermal interface material for dissipating thermal energy from an electronic device or a similar system requires heat removal. The thermal interface material is constructed from a base matrix comprising a polymer and 5 to 90 wt. % of boron nitride filler having a platelet structure, wherein the platelet structure of the boron nitride particles are substantially aligned for the thermal interface material to have a bulk thermal conductivity of at least 1 W/mK.

The invention further relates to a method for constructing a thermal interface material, by combining at least a base matrix comprising a polymer and 5 to 90 wt. % of boron nitride filler having a platelet structure, and causing the platelet structure of the boron nitride filler to align for the thermal interface material to have a bulk thermal conductivity of at least 1 W/mK.

DETAILED DESCRIPTION OF THE INVENTION

Figure 1:
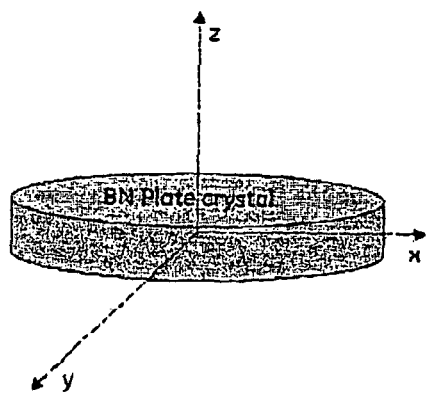
FIG. 1 is a perspective view illustrating the anisotropic characteristics of hBN platelets.

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases.

The invention relates to a thermal interface material comprising BN fillers in a matrix of interface material. In one embodiment, the composition comprises optional components such as dispersing agents, other type of fillers, etc.

Boron Nitride Component. The BN for use in the thermal interface material comprises crystalline or partially crystalline boron nitride particles made by processes known in the art. These include but are not limited to BN powder produced from a pressing process as disclosed in U.S. Pat. Nos. 5,898,009 and 6,048,511; BN agglomerated powder as disclosed in US Patent Publication No. 2005.0041373; BN powder having high thermal diffusivity as disclosed in US Patent Publication No. US20040208812A1; and highly delaminated BN powder as disclosed in U.S. Pat. No. 6,951,583. In one embodiment, the BN powder comprises BN particles of the platelet morphology.

In one embodiment, the BN powder has an average particle size of at least 2 microns ($\mu m$). In another embodiment, the BN powder has an average primary particle size of 1 to 50 $\mu m$. In a third embodiment, the BN powder has an average particle size of 5 to 50 $\mu m$. In one embodiment, the BN powder comprises irregularly shaped agglomerates of hBN platelets, having an average agglomerate size of above 10 μm. In one embodiment, the BN powder has an average agglomerate size from 4 to 500 μm. In one embodiment, the BN powder is a blend of different BN types, e.g., 10 to 40 vol. % of the BN powder display an average particle size of about 5 to 25 μm; about 60 to 90 vol. % of the particles display an average particle size of about 40 to 80 μm.

In one embodiment, the BN powder is in the form of platelets having an average length along the x-axis of at least about 1 micron, and along the y axis typically between about 1 and 20 μm, and a thickness of no more than about 5 microns. In another embodiment, the powder is in the form of platelets having an average aspect ratio of from about 1:5 to about 1:300. In yet another embodiment, the BN platelet aspect ratio ranges from about 1:10 to 1:100.

In one embodiment, the BN is an h-BN powder having a highly ordered hexagonal structure with a crystallization index of at least 0.12. In another embodiment, the BN powder has a crystallinity of about 0.20 to about 0.55, and in yet another embodiment, from about 0.30 to about 0.55. In yet another embodiment, the BN has a crystallization index of at least 0.55.

In one embodiment, the BN is used as a filler in the thermal interface composition in levels of 5 to 90 wt. % (of the total TIM weight). In a second embodiment, the BN is used at a filler loading of 10 to 70 wt. %. In a third embodiment, the BN filler loading ranges from 20 to 60 wt. %.

Polymer Matrix: Suitable matrix materials include, but are not limited to, polydimethylsiloxane resins, epoxy resins, acrylate resins, other organo-functionalized polysiloxane resins, polyimide resins, fluorocarbon resins, benzocyclobutene resins, fluorinated polyallyl ethers, polyamide resins, polyimidoamide resins, phenol cresol resins, aromatic polyester resins, polyphenylene ether (PPE) resins, bismaleimide resins, fluororesins, mixtures thereof and any other polymeric systems known to those skilled in the art. (For common polymers, see "Polymer Handbook: Branduf, J.; Immergut, E. H; Grulke, Eric A; Wiley Interscience Publication, New York, 4$^{th}$ ed.(1999); "Polymer Data Handbook Mark, James Oxford University Press, New York (1999)). Resins may also include hardenable thermoplastics.

In one embodiment, the polymeric matrix comprises a compliant material such as waxes or hot melts. Paraffin waxes, microwaxes, silicone waxes and formulations based on these may be used. Elastomers such as silicone, natural or synthetic rubber, acrylic, polyurethane, etc. may also be used. Glassy materials such as epoxy, phenolics, may also be suitable. In one embodiment, the polymeric matrix may be a crosslinked structure or "B-staged", including those which can be crosslinked by the user through thermal or radiative activation.

In one embodiment, the polymer matrix comprises at least two components with the first component being a single or multi-component elastomer, consisting of one or more of the following: silicone, acrylic, natural rubber, synthetic rubber, or other appropriate elastomeric materials. The second component is a melting point component to influence the melting point of the polymer matrix for achieving a melting point at around the operating temperature. Examples include $C_{12}$-$C_{16}$ alcohols, acids, esters, and waxes, low molecular weight styrenes, methyl triphenyl silane materials, combinations thereof, and the like. Suitable $C_{12}$-$C_{12}$-$C_{16}$ acids and alcohols include myristyl alcohol, cetyl alcohol, stearyl alcohol, myristyl acid, and stearic acid.

In yet another embodiment, the polymer matrix is produced by combining at least one rubber compound and at least one amine resin, for the thermal interface material to take on the form of a liquid or "soft gel." As used herein, "soft gel" means a colloid in which the disperse phase has combined with the continuous phase to form a viscous "jelly-like" product. The gel state is brought about through a crosslinking reaction between the at least one rubber compound composition and the at least one amine resin composition. The rubber can be either saturated or unsaturated. Amine and amino resins are those resins that comprise at least one amine substituent group on any part of the resin backbone. Amine and amino resins are also synthetic resins derived from the reaction of urea, thiourea, melamine or allied compounds with aldehydes, particularly formaldehyde.

In one embodiment, the matrix component comprises a polyolefin based composition which is capable of changing reversibly from a solid into a paste or liquid at an elevated temperature. In yet another embodiment, the polymer matrix can be an organic-inorganic hybrid matrix. Hybrid matrices include any polymers that contain chemically bound main group metal elements (e.g., aluminum, magnesium, gallium, indium), main group semi-metal elements (e.g. boron, germanium, arsenic, antimony), phosphorous, selenium, transition metal elements (e.g., platinum, palladium, gold, silver, copper, zinc, zirconium, titanium, ruthenium, lanthanum, etc.) or inorganic clusters (which include, but are not limited to, polyhedral oligomeric silsesquioxanes, nano metal oxides, nano silicon oxides, nano metal particles coated with metal oxides, and nano metal particles.) Organic-inorganic hybrid polymeric matrices may refer to, but are not limited to, copolymerization products between organic monomers, oligomers or polymers that contain polymerizable groups such as alkenyl, allyl, Si—H, acrylate, methacrylate, styrenic, isocyanate, epoxide and other common groups known to those skilled in the art, and inorganic clusters or organometallic compounds containing polymerizable groups. Organic-inorganic hybrid matrices also include cases where the inorganic cluster or organometallic compound has no polymerizable functional groups, but can become part of the polymer network through its surface OH or other functional groups.

Optional Additives: In certain applications, a fire retardant feature may be needed and/or may be required by applicable regulations in an amount ranging from 0.5 up to 10 wt. %. For example, TIMs used in electric or electronic applications may be directly exposed to electrical current, to short circuits, and/or to heat generated from the use of the associated electronic component or electrical device. Consequently, industry standards or regulations may impose conditions on the use of such TIMs that require qualifying tests be performed, such as burn tests, and the like. Fire retardants suitable for inclusion in the TIMs can be intumescent fire retardants and/or non-intumescent fire retardants. In other embodiments, the fire retardants are non-halogen containing and antimony-free. Blends of one or more fire retardants and/or a synergist and/or smoke suppressants may also be used in the TIMs of the invention. Selection of the fire retardant system will be determined by various parameters, for example, the industry standard for the desired application, and by composition of the film polymer matrix.

The TIM may also include a number of other additives other than materials expressly excluded above. Examples of suitable additives include tackifiers (e.g., rosin esters, terpenes, phenols, and aliphatic, aromatic, or mixtures of aliphatic and aromatic synthetic hydrocarbon resins), pigments, reinforcing agents, hydrophobic or hydrophilic silica, calcium carbonate, toughening agents, fibers, fillers, antioxidants, stabilizers, and combinations thereof. The foregoing additional agents and components are generally added in amounts sufficient to obtain an article having the desired end properties, in one embodiment, adhesive properties.

Process for Manufacturing The Thermal Interface Materials In one embodiment, the combined materials of polymer matrix, BN filler, and optional additives are first subject to forces or energy to homogenize the mix. The energy and/or forces align the structures within the BN for the BN platelets to be aligned so that the TIM has improved thermal conductivity. Homogenizing the composition involves the use of shear force, extensional force, compressive force, ultrasonic energy, electromagnetic energy, thermal energy or combinations comprising at least one of the foregoing forces or forms of energy and is conducted in processing equipment known in the art, wherein the aforementioned forces are exerted by a single screw, multiple screws, intermeshing co-rotating or counter rotating screws, non-intermeshing co-rotating or counter rotating screws, reciprocating screws, screws with pins, barrels with pins, rolls, rams, helical rotors, or combinations comprising at least one of the foregoing.

In one embodiment, the combined materials are subjected to shear forces and extruded into plastic pellets in a first step of homogenizing the mix. The plastic pellets are then fed into a profile extruder producing a continuous plastic sheet of constant thickness that is semi-viscous. In another embodiment, after profile extrusion, the semi-viscous plastic sheet can be further fed to a compression rolling stage in which the sheet is rolled on to form a concentric cylinder of cured BN-resin compound. As used herein, compression rolling means rolling the sheet using one roll, with another roll pressing/applying a load onto the sheet. Due to the extrusion pressure and shear, a plurality of the BN platelets align themselves in a direction parallel to the extruding direction.

Figure 2:
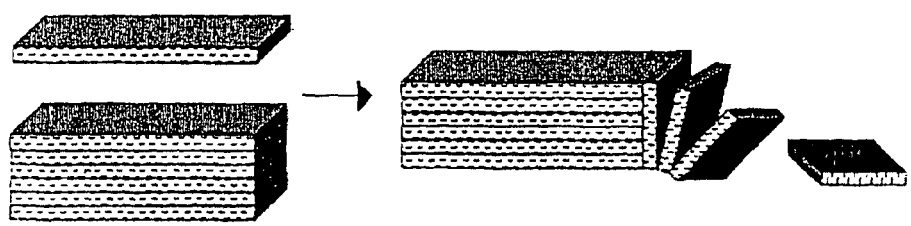
FIG. 2 is a diagram illustrating an embodiment for making the thermal interface of the invention, wherein the thermal pads are stacked, pressed, cured and sliced along the stacking direction.

In one embodiment as illustrated in FIG. 2, the sheet from the profile extruder (or after compression rolling) is cut into desired size and stacked one by one to a desired height followed by pressing and optional curing at temperatures 100-150° C. for about 15-30 min in a hull press. After stacking, the extruded/cured block is cut into sheets having a thickness ranging from 0.1 to 5 mm, in a direction perpendicular to the stacking direction (or the z direction of FIG. 1).

Figure 3:
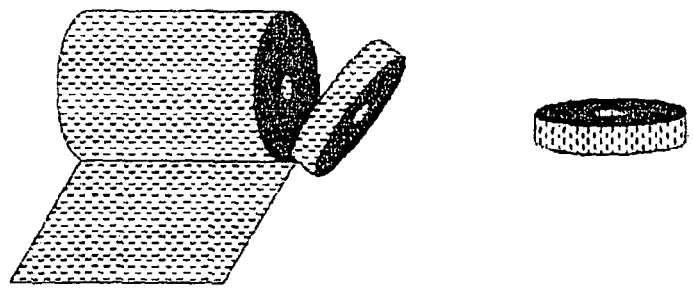
FIG. 3 is a diagram illustrating yet another embodiment for making the thermal interface of the invention, wherein the thermal pads are rolled, cured and sliced into circular disks.

In one embodiment, the BN/polymer mixture (in the pellet form, or a direct mixture of BN in a polymer matrix) is first extruded forming a straight cylinder of an appropriate diameter. In yet another embodiment as illustrated in FIG. 3, the sheet from the profile extruder containing the BN/polymer mixture is rolled into a cylinder, then followed by pressing and optional curing forming a cylindrical block. The rolled/extruded/cured cylindrical block is next cut into circular discs in a direction perpendicular to the cylindrical axis, generating thermal pads having the BN plates oriented along the z direction of the thermal pads.

As the thermal interface material has a plurality of BN platelets aligning in the direction parallel to the z-axis of the pad, it exhibits increased thermal conductivity through the plane of the pad. This is due to the highly anisotropic nature of hBN, and the higher thermal conductivity along the a-b plane compared to that along the c-direction. In a regular method of thermal interface pad making process, the BN filler platelets lie along the plane of the pad and the thermal conductivity through the plane is much smaller than in-plane thermal conductivity. This invention makes use of the high thermal conductivity along the a-b plane of the BN platelets by modifying the orientation of the filler materials in the pad.

In one embodiment, the TIM according to the invention has the bulk thermal conductivity of at least about 1-12 W/m-K with a BN filler loading of 5 to 90 wt. %. In another embodiment and depending of the amount of BN fillers, the polymer matrix, as well as the properties of the hBN used, a sufficient number of BN platelets are aligned for the TIM to have a bulk thermal conductivity of at least 2 W/mK. In a third embodiment with at least a 30 wt. % BN loading, the TIM has a bulk thermal conductivity of at least 1 W/mK. In a fourth embodiment with at least 50 wt. % BN loading, the TIM has a bulk thermal conductivity of at least 3 W/mK. In one embodiment, the TIM has a BN loading of about 20 to about 60% by weight.

The TIM can be used as a pad or a layer providing a thermal interface between an active device or heat source, such as a microprocessor power supply assembly, and a heat sink, such as a block of heat transmissive material, to facilitate heat transfer from the device to the heat sink. The heat source or device can be any type of semiconductor device or power supply assembly that generates excess heat in its operation, which heat if not removed, may damage the device or impair operation of the device.

In one embodiment, the thermal interface pad has a thickness of about 0.025 to 2.5 millimeters in thickness. The pad thickness can be further increased to accommodate certain application requirements, such as larger spacing characteristics in electronics or power supply cooling application.

Applications of the Thermal Interface Material. In one embodiment, the thermally conductive formulation may be applied as is, i.e., as a grease, gel and phase change material formulations. In another embodiment, the compositions can be pre-formed into sheets or films and cut into any desired shape for positioning between electronic components. Alternatively, the composition can be pre-applied to either the heat generating or heat dissipating unit of a device, B-staged and stored. The assembled unit can then be attached to a heat dissipating or heat generating unit and cured to completeness.

In one embodiment wherein the TIM consists of a mixture of a phase change substance and the BN filler, the TIM has a sufficient cohesive strength to allow handling in a roll form or as pre-cut pieces. Other embodiments of the TIM of the invention include tapes and transfer tapes.

EXAMPLES

Examples are provided herein to illustrate the invention but are not intended to limit the scope of the invention.

Comparative Examples A

In the examples, BN powder is commercially available from Momentive Performance Materials Inc. of Strongsville, Ohio, as PT110 (hexagonal platelet BN having an average particle size of 45 microns). BN powder is mixed in a lab scale FlackTek speed mixer at approximately 3500 rpm with Sylgard 184 Silicone Resin and curing agent Sylgard 184. The mixture is placed in a 3"×5" rectangular mold and pressed in a Hull press at 130° C. for 30 minutes to form pads of about 1 mm in thickness. The bulk thermal conductivity is measured via a Mathis™ Hot Disk Thermal Constant Analyzer.

Examples B

In examples B, the pads of Examples A are cut into circular discs of 1" diameter, stacked together forming a stack of 1" thick with Sylgard 184 lightly applied in between the layers. This 1" stack is again pressed and cured in the Hull press for 30 min. Slices are made from the stack by cutting along the pressing direction. Bulk thermal conductivity is measured of the resulting sliced pads which have aligned BN platelets.

Table 1 compares the thermal conductivity of the TIM of the prior art vs. the TIM of the invention having aligned BN platelets.

TABLE 1

| BN Wt % | Through-plane thermal conductivity (W/mK) | | |
|---|---|---|---|
| | Examples A | Examples B | x increase |
| 35.5 | 0.64 | 0.93 | 1.5 |
| 48.4 | 0.8 | 2.4 | 3.0 |
| 59.3 | 0.8 | 4.4 | 5.3 |
| 68.6 | 1.3 | 8.1 | 6.0 |
| 76.6 | 2.1 | 10.8 | 5.1 |

While the invention has been described with reference to a preferred embodiment, those skilled in the art will understand that various changes may be made and equivalents may be substituted for elements thereof without departing from the scope of the invention. It is intended that the invention not be limited to the particular embodiment disclosed, but that the invention will include all embodiments falling within the scope of the appended claims. All citations referred to are expressly incorporated herein by reference.

We claim:

1. A thermal interface material comprising a base matrix comprising a polymer and 5 to 90 wt. % of boron nitride filler having a platelet structure, the interface material having a x-y plane and a z plane, the z plane being oriented through the thickness of the interface material, wherein the platelet structure of the boron nitride particles are substantially aligned parallel to the z plane of the material for the thermal interface material to have a bulk thermal conductivity of at least 1 W/mK.

2. The thermal interface material of claim 1, in a form of a film, a pad, a sheet, a pressure sensitive adhesive, hot melt adhesive, low surface energy adhesive, epoxy, thermal bond film, phase change material, or grease.

3. The thermal interface material of claim 1, wherein the boron nitride filler is present in an amount of about 20 to 60 wt. % of the total weight of the thermal interface and wherein the thermal interface material has a bulk thermal conductivity of at least 1 W/mK.

4. The thermal interface material of claim 1, wherein the boron nitride filler has an average primary particle size of 1 to 50 μm.

5. The thermal interface material of claim 1, wherein the boron nitride filler has an average primary agglomerate size of 1 to 500 μm.

6. The thermal interface material of claim 1, wherein the boron nitride filler has an average primary agglomerate size of 5 to 500 μm.

7. The thermal interface material of claim 1, wherein 10 to 40 vol. % of the BN filler displays an average particle size of about 5 to 25 μm and about 60 to 90 vol. % of the filler displays an average particle size of about 40 to 80 μm.

8. The thermal interface material of claim 1, wherein the BN filler has an average aspect ratio of from about 1:5 to about 1:300.

9. The thermal interface material of claim 1, wherein the BN filler has an average aspect ratio ranges from about 1:10 to 1:100.

10. The thermal interface material of claim 1, wherein the polymer matrix comprises a polymeric composition selected from the group consisting of an α-olefin based polymer, an ethylene/α-olefin copolymer, an ethylene/a-olefin/non-conjugated polyene random opolymer, a polyol-ester, and an organosiloxane.

11. The thermal interface material of claim 1, wherein the material is formed by (a) providing a plurality of sheets having an x-y plane and a z-plane comprising the platelet boron nitride particles aligned in parallel to the x-y plane, (b) stacking and pressing the sheets to form a block, and (c) cutting the block in a direction perpendicular to the stacking direction to provide a thermal interface material having a z-plane comprising boron nitride platelet particles aligned parallel to the z-plane of the cut material.

12. A process for making a thermal interface material having a x-y plane and a z plane, the z plane being oriented through the thickness of the interface material, wherein the process comprises:
    combining at least a base matrix comprising a polymer and 5 to 90 wt. % of boron nitride filler having a platelet structure, and
    causing the platelet structure of the boron nitride filler to align in a direction parallel to the z direction of the material for the thermal interface material to have a bulk thermal conductivity of at least 1 W/mK.

13. The process of claim 12, wherein the step of causing the platelet structure of the boron nitride filler to align comprises applying a shear force to the combined material.

14. The process of claim 12, wherein combining at least a base matrix comprising a polymer and 5 to 90 wt. % of boron nitride filler comprises using at least one of a single screw, a multiple screw, an intermeshing co-rotating, a counter rotating screw, a non-intermeshing co-rotating screw, a counter rotating screw, a reciprocating screw, a screw with pins, a barrel with pins, rolls, rams, helical rotors, or combinations thereof.

15. The process of claim 12, wherein combining at least a base matrix comprising a polymer and 5 to 90 wt. % of boron nitride filler comprises applying a shear force to the combined material by extruding the combined material into a roll having cylindrical geometry having a c-axis and slicing the extruded roll in a direction perpendicular to the c-axis of the cylinder to align the BN platelets in the thermal interface material.

16. The process of claim 12, further comprising the step of profile extruding the combined mixture into a continuous sheet.

17. The process of claim 16, further comprising the steps of:
    compression rolling the extruding the sheet into a roll,
    curing and slicing the roll into a plurality of pads in a direction perpendicular to the rolling direction.

18. The process of claim 12, further comprising the step of profile extruding into sheets of thickness 0.1 to 5 mm.

19. The process of claim 18, further comprising the steps of cutting the sheets into desired sizes;
    stacking the sheets into to a desired height;
    pressing the stacked sheets at a sufficient temperature and pressure and for a sufficient period of time for the sheets to cure;
    cutting the cured sheets in a direction perpendicular to the stacking direction.

20. The process of claim 19, wherein the pressing and curing is at a temperature of at least 100° C. for at least 10 minutes.

* * * * *